United States Patent
Sobue

(10) Patent No.: US 12,484,312 B2
(45) Date of Patent: Nov. 25, 2025

(54) SEMICONDUCTOR INTEGRATED CIRCUIT DEVICE

(71) Applicant: SOCIONEXT INC., Kanagawa (JP)

(72) Inventor: Isaya Sobue, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 650 days.

(21) Appl. No.: 17/895,785

(22) Filed: Aug. 25, 2022

(65) Prior Publication Data

US 2022/0415882 A1 Dec. 29, 2022

Related U.S. Application Data

(63) Continuation of application No. PCT/JP2020/007651, filed on Feb. 26, 2020.

(51) Int. Cl.
*H01L 27/02* (2006.01)
*H10D 89/60* (2025.01)

(52) U.S. Cl.
CPC .................. *H10D 89/921* (2025.01)

(58) Field of Classification Search
CPC .... H10D 89/921; H10D 84/00; H10D 89/811; H10D 89/931
See application file for complete search history.

(56) References Cited

U.S. PATENT DOCUMENTS

| | | | | |
|---|---|---|---|---|
| 7,478,354 B2* | 1/2009 | McGrath | .................. | G06F 30/39 |
| | | | | 257/E27.11 |
| 7,969,186 B2* | 6/2011 | Heaton | ............ | H03K 19/17704 |
| | | | | 326/38 |
| 8,392,865 B2* | 3/2013 | Malekkhosravi | ....... | G06F 30/30 |
| | | | | 326/38 |
| 8,773,163 B1* | 7/2014 | Park | .................... | H03K 19/1732 |
| | | | | 326/82 |
| 9,577,640 B1 | 2/2017 | Park et al. | | |
| 2003/0178648 A1* | 9/2003 | Bansal | ................. | H10D 84/907 |
| | | | | 257/202 |
| 2005/0257177 A1* | 11/2005 | Chen | ....................... | G06F 30/30 |
| | | | | 716/106 |
| 2006/0253825 A1* | 11/2006 | McGrath | ................ | G06F 30/30 |
| | | | | 326/38 |

(Continued)

FOREIGN PATENT DOCUMENTS

| | | |
|---|---|---|
| JP | H04-177861 A | 6/1992 |
| JP | H05-175439 A | 7/1993 |

(Continued)

OTHER PUBLICATIONS

International Search Report issued in corresponding International Patent Application No. PCT/JP2020/007651, dated May 26, 2020, with English translation.

*Primary Examiner* — Jarrett J Stark
(74) *Attorney, Agent, or Firm* — Rimon P.C.

(57) ABSTRACT

In an IO region of a semiconductor integrated circuit device, placed is an IO cell row including a signal IO cell and a power IO cell supplying a first power supply. The power IO cell includes first and second external terminals connected to an external connection pad and an electrostatic discharge (ESD) protection device formed at least in a region between the first and second external terminals. The first external terminal is placed at a position having an overlap in the Y direction with a power supply line for a second power supply.

6 Claims, 9 Drawing Sheets

(56) References Cited

U.S. PATENT DOCUMENTS

| | | | |
|---|---|---|---|
| 2006/0259841 A1* | 11/2006 | Savage | G01R 31/31704 |
| | | | 714/733 |
| 2006/0259892 A1* | 11/2006 | McGrath | H10D 89/601 |
| | | | 700/121 |
| 2008/0174925 A1* | 7/2008 | Woo | H03G 1/0005 |
| | | | 361/56 |
| 2012/0025272 A1* | 2/2012 | Usami | H01L 24/06 |
| | | | 716/55 |
| 2014/0246701 A1 | 9/2014 | Parks et al. | |
| 2014/0246702 A1 | 9/2014 | Parks et al. | |
| 2014/0246724 A1* | 9/2014 | Jang | G11C 11/404 |
| | | | 257/368 |
| 2014/0247525 A1 | 9/2014 | Parks et al. | |
| 2018/0097357 A1* | 4/2018 | Di Sarro | H02H 9/046 |
| 2019/0385945 A1 | 12/2019 | Ito et al. | |
| 2020/0083252 A1* | 3/2020 | Sobue | H10D 89/10 |
| 2021/0175172 A1* | 6/2021 | Sobue | H10D 89/921 |
| 2021/0351202 A1 | 11/2021 | Sobue | |
| 2023/0139094 A1* | 5/2023 | Morishita | H10D 89/921 |
| | | | 257/546 |

FOREIGN PATENT DOCUMENTS

| | | | | |
|---|---|---|---|---|
| JP | 2002-246470 A | 8/2002 | | |
| JP | 2008-78354 A | 4/2008 | | |
| JP | 2013-21249 A | 1/2013 | | |
| JP | 2015-532530 A | 11/2015 | | |
| WO | 2018/180010 A1 | 10/2018 | | |
| WO | WO-2018211931 A1 * | 11/2018 | | H01L 21/82 |

* cited by examiner

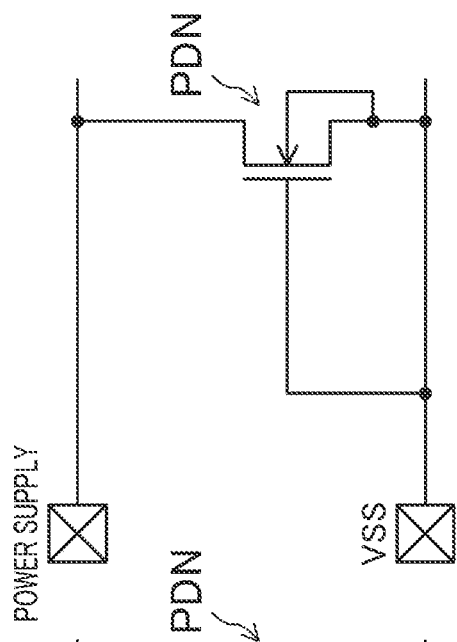
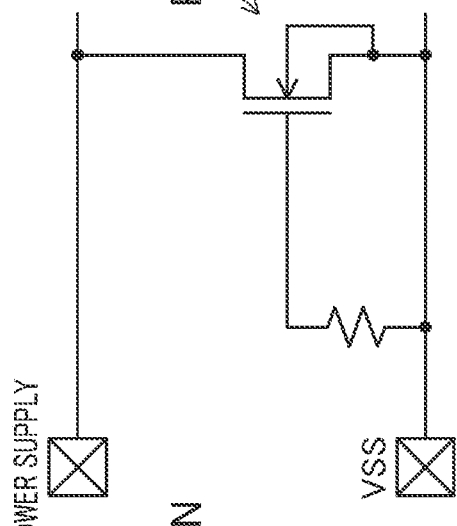
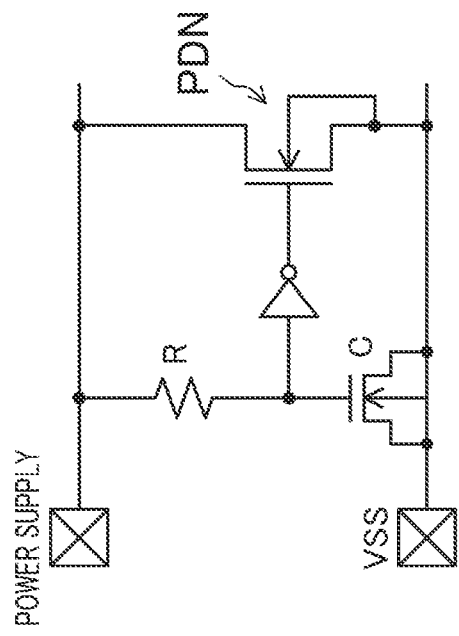
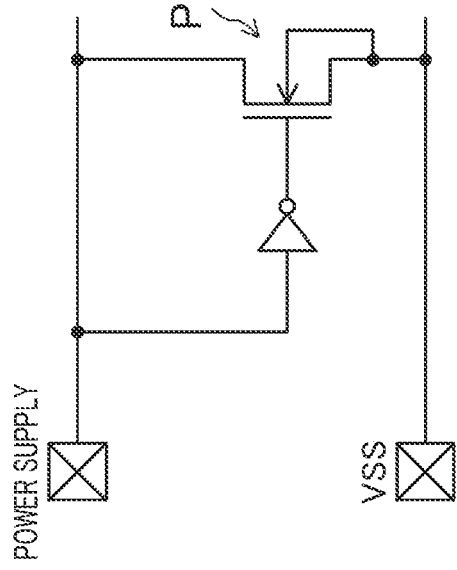

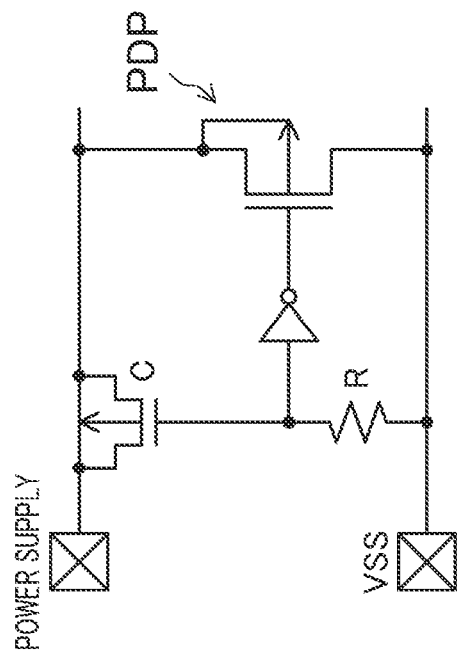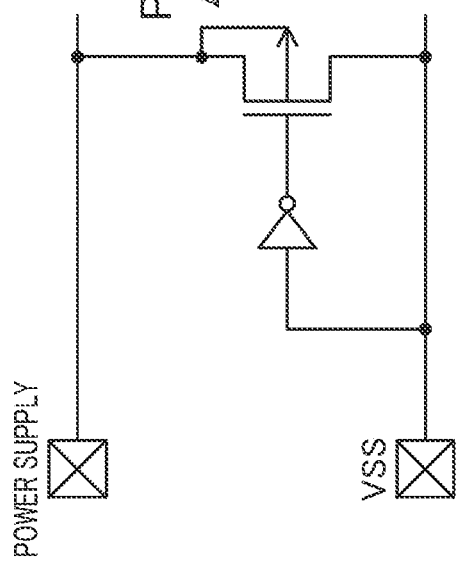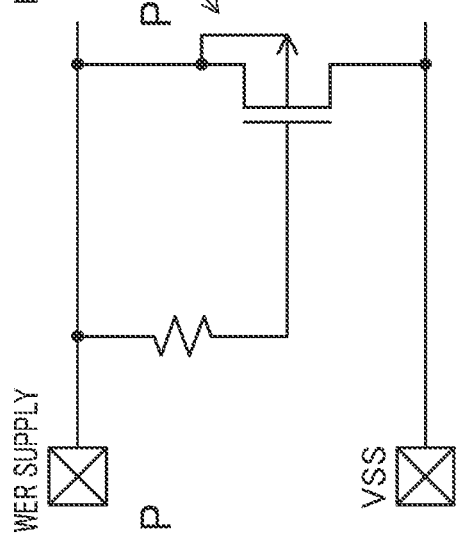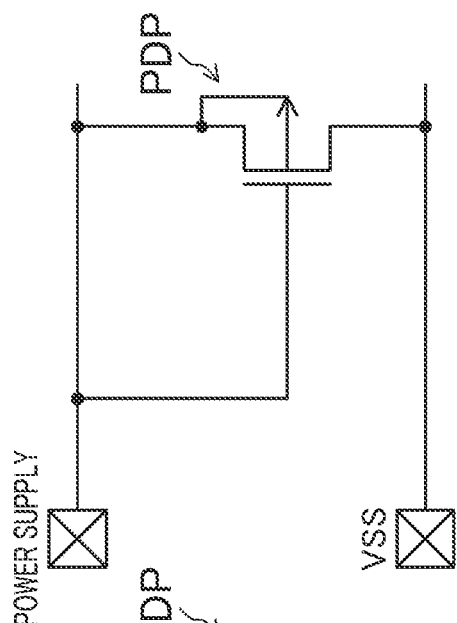

SEMICONDUCTOR INTEGRATED CIRCUIT DEVICE

CROSS-REFERENCE TO RELATED APPLICATIONS

This is a continuation of International Application No. PCT/JP2020/007651 filed on Feb. 26, 2020. The entire disclosure of this application is incorporated by reference herein.

BACKGROUND

The present disclosure relates to a semiconductor integrated circuit device having a core region and an IO region where input/output cells (IO cells) are placed.

In recent semiconductor integrated circuits, with the progress of miniaturization, the wiring resistance is increasing, and also the power supply voltages are becoming lower. This raises problems such as decrease in electrostatic discharge (ESD) tolerance. To improve the ESD tolerance, the resistance value on the route from a power supply pad to an ESD protection device is required to be small. It is however difficult to achieve this due to the increase of the wiring resistance.

Japanese Unexamined Patent Publication No. 2008-78354 discloses a technique of mutually connecting power supply lines (VDD)/ground lines (VSS) in IO cells and power supply lines for inner circuits in an inner circuit formation part, for the purpose of strengthening power supply lines.

In the technique of the cited patent document, however, the area of the semiconductor integrated circuit device increases because wiring resources are necessary for both VDD power supply lines and VSS power supply lines in the core region. In the cited patent document, also, no examination has been made on a detailed structure of lines connected to ESD protection devices in the IO cells.

An objective of the present disclosure is providing a configuration of a semiconductor integrated circuit device where IO cells are placed, capable of improving ESD tolerance while preventing increase in area.

SUMMARY

According to one mode of the present disclosure, a semiconductor integrated circuit device includes: a chip; a core region provided on the chip; an IO region provided on the chip; and an IO cell row placed in the IO region, including a plurality of IO cells arranged in a first direction that is a direction along an outer edge of the chip, wherein the plurality of IO cells include a signal IO cell performing input, output, or input/output of a signal, and a power IO cell supplying a first power supply to at least either the core region or the IO region, the power IO cell includes first and second external terminals connected to an external connection pad for the first power supply, and an electrostatic discharge (ESD) protection device provided between the first power supply and a second power supply, formed at least in a region between the first external terminal and the second external terminal, and connected to the first and second external terminals, in the signal IO cell, a plurality of power supply lines for the second power supply extending in the first direction are placed, and the second external terminal is placed at a position having an overlap in a second direction, which is a direction vertical to the first direction, with one of the plurality of power supply lines.

According to the above mode, the power IO cell supplying the first power supply includes first and second external terminals connected to an external connection pad for the first power supply and an ESD protection device provided between the first power supply and the second power supply. The ESD protection device, formed at least in a region between the first and second external terminals, is connected to the first and second external terminals. That is, since the ESD protection device is electrically connected to at least two external terminals, the resistance value on the route from the first power supply to the ESD protection device is low. Also, the second external terminal is placed at a position having an overlap in the second direction with one of a plurality of power supply lines for the second power supply extending in the first direction placed in the signal IO cell. It is therefore possible to place the second external terminal without increasing the area of the semiconductor integrated circuit device. Thus, in the semiconductor integrated circuit device where IO cells are placed, it is possible to improve ESD tolerance while preventing increase in area.

According to the semiconductor integrated circuit device of the present disclosure, it is possible to improve ESD tolerance while preventing increase in area.

BRIEF DESCRIPTION OF THE DRAWINGS

FIGS. 3A-3D show circuit examples of an ESD protection circuit.

FIGS. 4A-4D show circuit examples of an ESD protection circuit.

DETAILED DESCRIPTION

An embodiment of the present disclosure will be described hereinafter with reference to the accompanying drawings.

Figure 1:
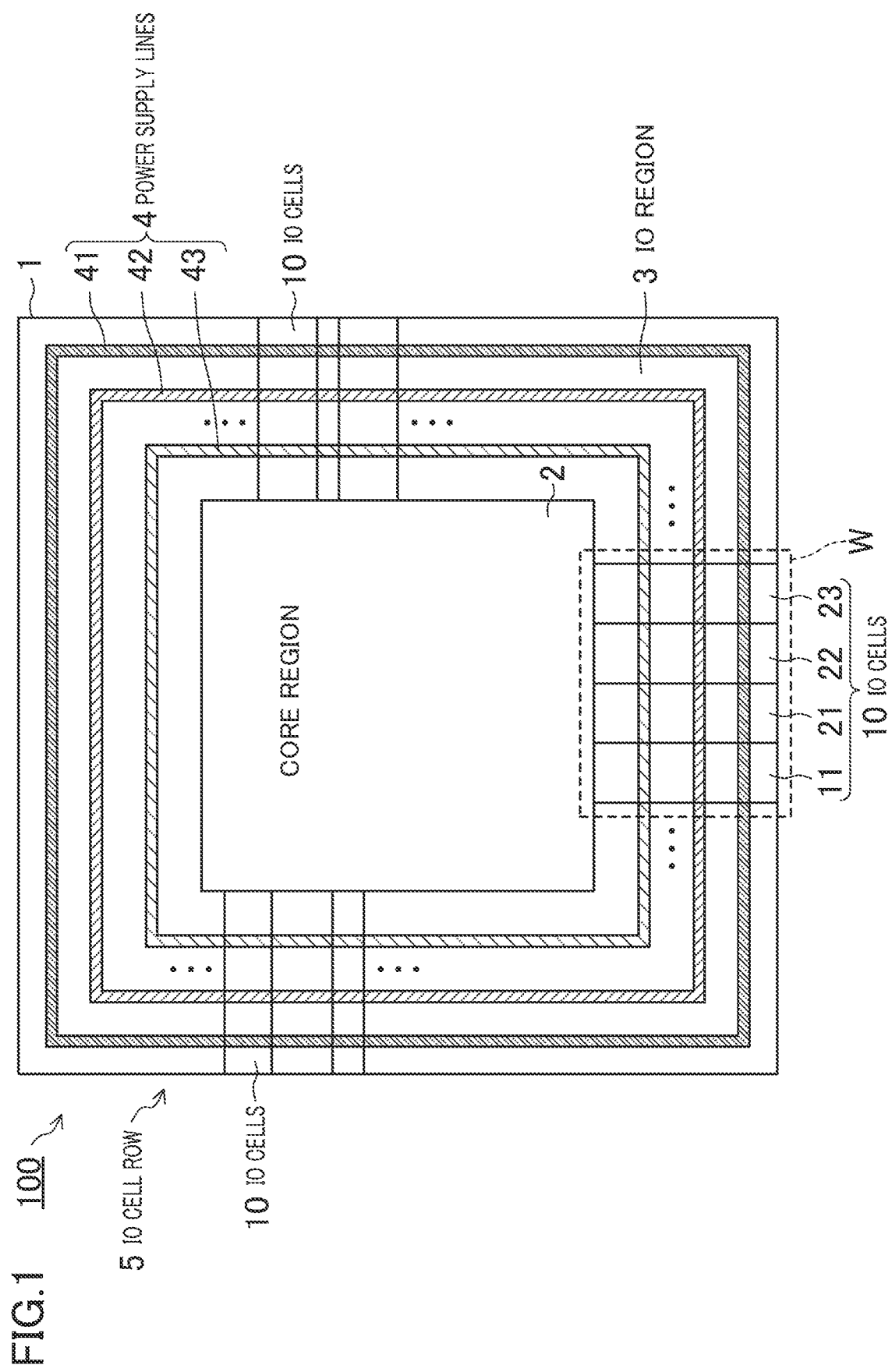
FIG. 1 is a plan view schematically showing the entire configuration of a semiconductor integrated circuit device according to an embodiment.

FIG. 1 is a plan view schematically showing the entire configuration of a semiconductor integrated circuit device (semiconductor chip) according to the embodiment. A semiconductor integrated circuit device 100 shown in FIG. 1 includes, on a chip 1, a core region 2 in which inner core circuits are formed and an IO region 3 in which interface circuits (IO circuits) are formed. The IO region 3 is located around the core region 2. In the IO region 3, an IO cell row 5 is formed along the outer edges of the chip 1. Although illustration is simplified in FIG. 1, a plurality of IO cells 10 constituting interface circuits are arranged in the IO cell row 5.

In the illustrated example, the IO cells 10 include a signal IO cell 11 performing input, output, or input/output of a signal, an IO power IO cell 21 for supplying power (power supply voltage VDDIO) mainly to the IO region 3, a VSS IO cell 22 for supplying ground potential (power supply voltage VSS), and a core power IO cell 23 for supplying power (power supply voltage VDD) mainly to the core region 2. VDDIO is higher than VDD: e.g., VDDIO is 3.3 V and VDD is 1.0 V. In this disclosure, the IO power IO cell, the VSS IO cell, and the core power IO cell are collectively called power IO cells as appropriate.

In the IO region 3, provided are power supply lines 4 extending in the direction in which the IO cells 10 are arranged. In the illustrated example, the power supply lines 4 include a power supply line 41 supplying VSS, a power supply line 42 supplying VDDIO, and a power supply line 43 supplying VDD. While the power supply lines 41, 42, and 43 are each illustrated as a single line in FIG. 1, they may be each constituted by a plurality of lines actually as will be described later. Also, although illustration is omitted in FIG. 1, a plurality of external connection pads are provided in the semiconductor integrated circuit device 100.

Figure 2:
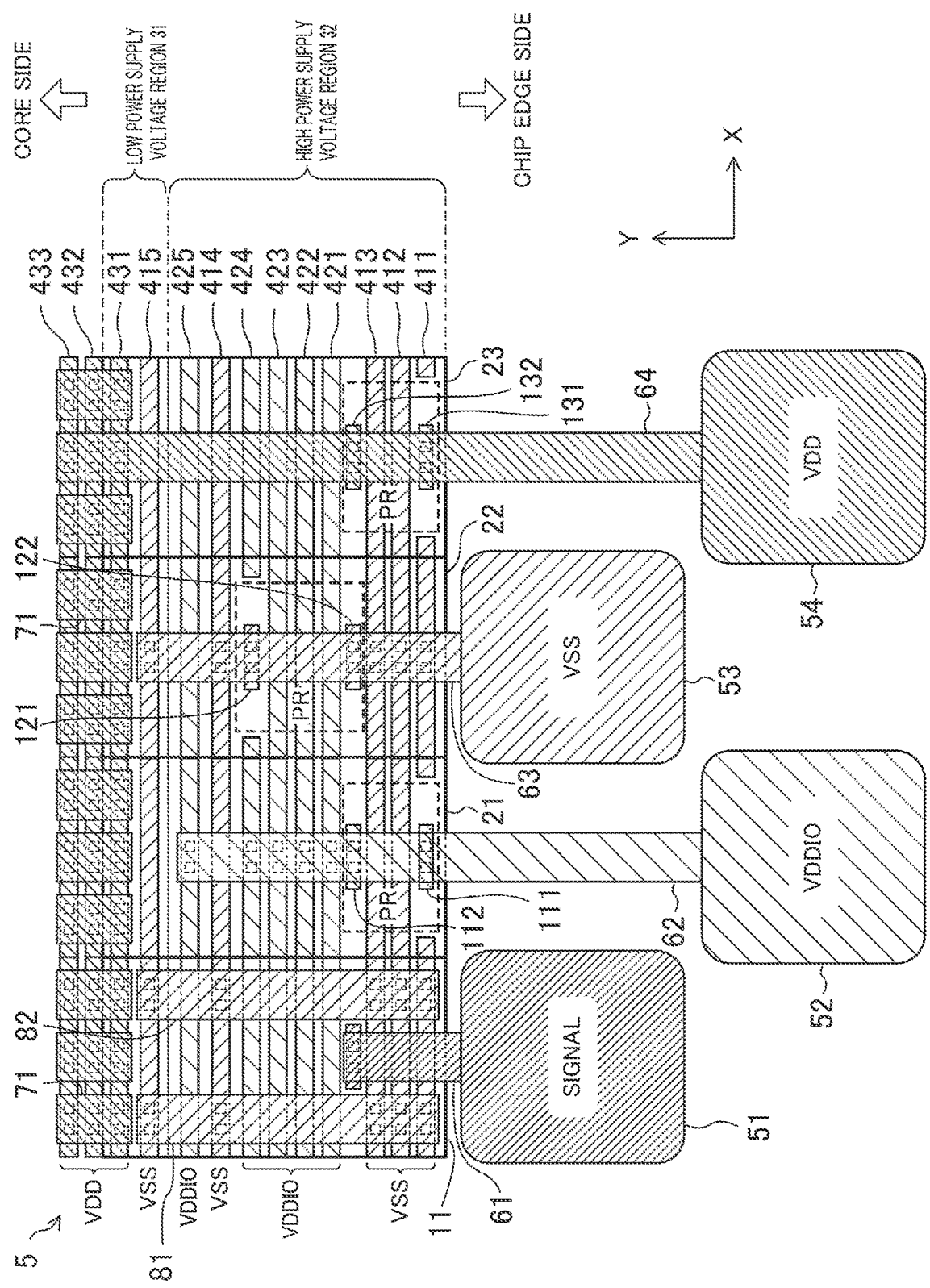
FIG. 2 is a plan view showing a configuration example of an IO region in the first embodiment.

FIG. 2 is a plan view showing a configuration example of the IO region 3 of the semiconductor integrated circuit device 100 according to this embodiment, which corresponds to an enlarged view of a part W of FIG. 1. Note that illustration of the internal configuration of the IO cells 10, signal lines, etc. is omitted in FIG. 2. Also, the power supply line supplying VDDIO, the power supply line supplying VSS, and the power supply line supplying VDD are hatched differently from one another. This also applies to the plan views to follow.

In FIG. 2, the IO cell row 5 includes a plurality of IO cells 10, specifically, the signal IO cell 11 and the power IO cells, i.e., the IO power IO cell 21, the VSS IO cell 22, and the core power IO cell 23, arranged in an X direction (the horizontal direction in the figure, which is a direction along the outer edge of the chip 1, corresponding to the first direction). In the illustrated example, the IO cells 10 are the same in height, i.e., size in a Y direction (the vertical direction in the figure, corresponding to the second direction vertical to the first direction).

The signal IO cell 11 includes circuits required for exchange of signals with the outside of the semiconductor integrated circuit device 100 or with the core region 2, such as a level shifter circuit, an output buffer circuit, and a circuit for ESD protection, for example. The IO power IO cell 21, the VSS IO cell 22, and the core power IO cell 23, which are for supplying power fed to external connection pads to the inside of the semiconductor integrated circuit device 100, include ESD protection circuits, etc.

An IO cell generally has: a high power supply voltage region including an ESD protection circuit and an output buffer for outputting a signal outside the semiconductor integrated circuit device; and a low power supply voltage region including circuits for input/output of signals into/from the inside of the semiconductor integrated circuit device. The IO cells 10 in FIG. 2 are each divided into a low power supply voltage region 31 and a high power supply voltage region 32 in the Y direction. The low power supply voltage region 31 is on the core region side, and the high power supply voltage region 32 is on the chip edge side.

A plurality of power supply lines extending in the X direction are provided in the region of the IO cell row 5. Specifically, power supply lines 411, 412, 413, 414, and 415 constituting the power supply line 41 supplying VSS, power supply lines 421, 422, 423, 424, and 425 constituting the power supply line 42 supplying VDDIO, and power supply lines 431, 432, and 433 constituting the power supply line 43 supplying VDD are provided. The power supply lines 431 to 433 supplying VDD and the power supply line 415 supplying VSS are in the low power supply voltage region 31. The power supply lines 411 to 414 supplying VSS and the power supply lines 421 to 425 supplying VDDIO are in the high power supply voltage region 32.

Note that the power supply lines 432 and 433 supplying VDD are provided at positions off the low power supply voltage region 31 on the core region 2 side. In other words, the power supply line 43 supplying VDD has a portion (the power supply lines 432 and 433) protruding from the low power supply voltage region 31 toward the core region 2. Transistors and interconnects to be placed in the core region 2 may be placed under the power supply lines 432 and 433. That is, the portion protruding from the low power supply voltage region 31 toward the core region 2 may overlap transistors placed in the core region 2 as viewed in plan. Otherwise, space may be provided between the core region 2 and the IO cell row 10 under the power supply lines 432 and 433.

External connection pads 51, 52, 53, and 54 are provided. The external connection pad 51, which is for signal input/output, is connected to the signal IO cell 11 through an interconnect 61 extending in the Y direction. The external connection pad 52, which is for VDDIO, is connected to the IO power IO cell 21 through an interconnect 62 extending in the Y direction. The external connection pad 52 is also connected to the power supply lines 421 to 425 through the interconnect 62. The external connection pad 53, which is for VSS, is connected to the VSS IO cell 22 through an interconnect 63 extending in the Y direction. The external connection pad 53 is also connected to the power supply lines 411 to 415 through the interconnect 63. The external connection pad 54, which is for VDD, is connected to the core power IO cell 23 through an interconnect 64 extending in the Y direction. The external connection pad 54 is also connected to the power supply lines 431 to 433 through the interconnect 64.

In the signal IO cell 11, provided are reinforcing interconnects 81 and 82 that mutually connect the power supply lines 411 and 415. The reinforcing interconnects 81 and 82 extend in the Y direction in an interconnect layer above the power supply lines 411 to 415. The thickness of the reinforcing interconnects 81 and 82 is preferably greater than that of the power supply lines 411 to 415.

Also, the power supply lines 431 to 433 are mutually connected by reinforcing interconnects 71 extending in the Y direction. The reinforcing interconnects 71 extend in an interconnect layer above the power supply lines 431 to 433. The thickness of the reinforcing interconnects 71 is preferably greater than that of the power supply lines 431 to 433.

It is herein assumed that the power supply lines 411 to 415, 421 to 425, and 431 to 433 extending in the X direction are formed in the same interconnect layer. It is also assumed that the interconnects 61 to 64, 71, 81, and 82 extending in the Y direction are located above the power supply lines 411 to 415, 421 to 425, and 431 to 433 extending in the X direction, and formed in the same interconnect layer.

An ESD protection circuit having an ESD protection device is provided in each of the power IO cells. In FIG. 2, the region in which the ESD protection device is placed is indicated by the broken line (marked as "PR") in each of the IO power IO cell 21, the VSS IO cell 22, and the core power IO cell 23. In the IO power IO cell 21 and the VSS IO cell 22, the ESD protection device is provided between VDDIO and VSS. In the core power IO cell 23, the ESD protection device is provided between VDD and VSS. A MOS transistor is used as the ESD protection device, for example.

FIGS. 3A-3D and 4A-4D show circuit examples of the ESD protection circuit. FIGS. 3A-3D show examples using an n-type MOS transistor PDN as the ESD protection device, and FIGS. 4A-4D show examples using a p-type MOS transistor PDP as the ESD protection device.

Referring back to FIG. 2, in the IO power IO cell 21, external terminals 111 and 112 connected to the external connection pad 52 through the interconnect 62 and vias are placed near the ESD protection device. VDDIO is supplied to the external terminals 111 and 112. The external terminal 111 is formed at roughly the same position in the Y direction as the power supply line 411 supplying VSS. In the VSS IO cell 22, external terminals 121 and 122 connected to the external connection pad 53 through the interconnect 63 and vias are placed near the ESD protection device. VSS is supplied to the external terminals 121 and 122. The external terminal 121 is formed at roughly the same position in the Y direction as the power supply line 424 supplying VDDIO. In the core power IO cell 23, external terminals 131 and 132 connected to the external connection pad 54 through the interconnect 64 and vias are placed near the ESD protection device. VDD is supplied to the external terminals 131 and 132. The external terminal 131 is formed at roughly the same position in the Y direction as the power supply line 411 supplying VSS.

Figure 5:
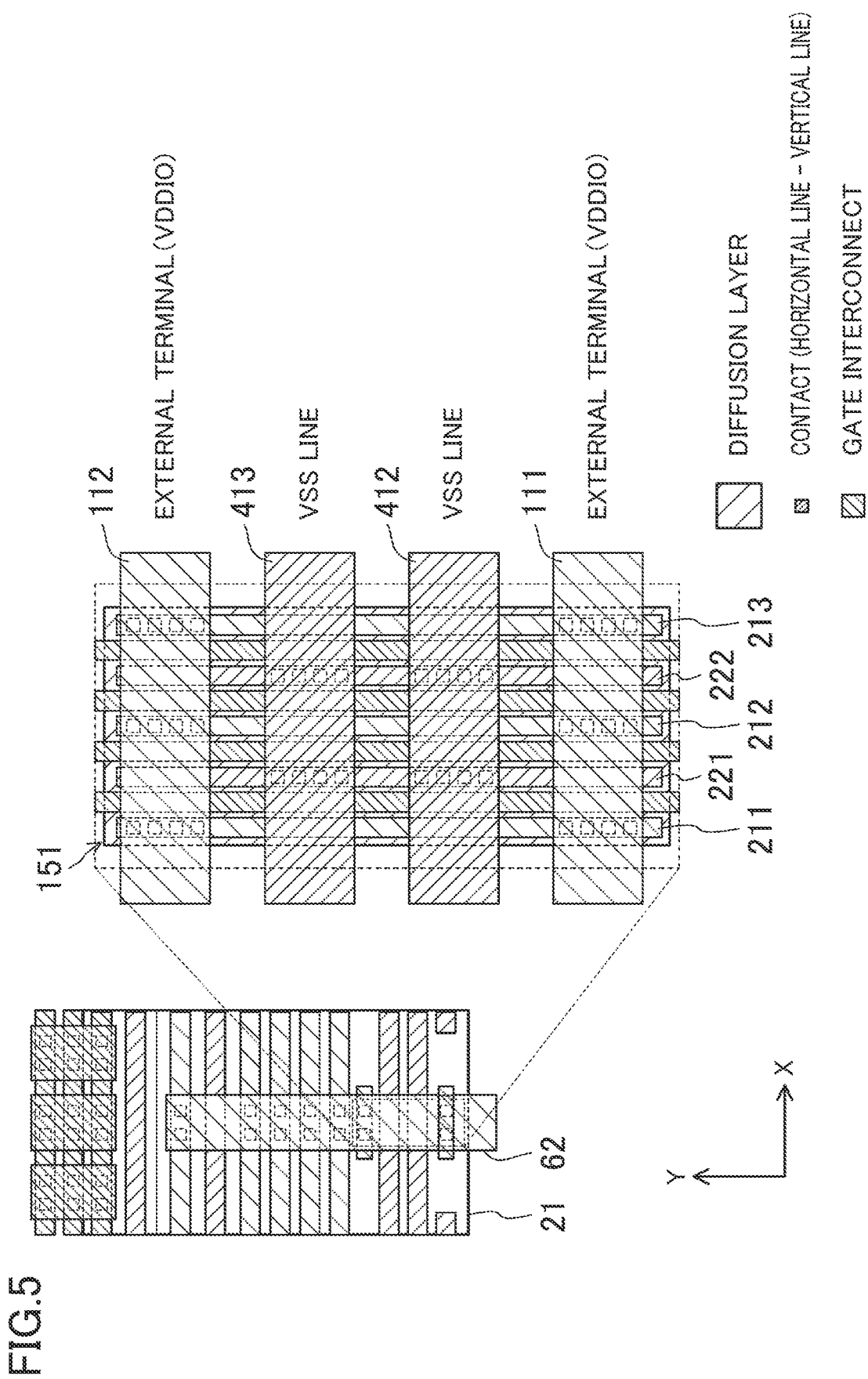
FIG. 5 is a plan view showing a configuration of a neighborhood of an ESD protection device in an IO power IO cell.

FIG. 5 is a plan view showing a configuration of a neighborhood of the ESD protection device in the IO power IO cell 21. Note that, in the detailed view on the right in FIG. 5, the interconnect 62 extending in the Y direction is omitted for easy viewing. This also applies to detailed views to follow.

In FIG. 5, interconnects 211, 212, and 213 and interconnects 221 and 222 extending in the Y direction are formed in an interconnect layer below the interconnect layer in which the external terminals 111 and 112 and the power supply lines 412 and 413 are formed. A transistor 151 as the ESD protection device is formed under the interconnects 211, 212, and 213 and the interconnects 221 and 222. The interconnects 211, 212, and 213 are connected to a diffusion layer of the transistor 151 and also connected to the external terminals 111 and 112 through contacts. The interconnects 221 and 222 are connected to a diffusion layer of the transistor 151 and also connected to the power supply lines 412 and 413 through contacts. Thus, the drain and source of the transistor 151 are connected to VDDIO and VSS, respectively.

The source of the transistor 151 is connected to the power supply lines 412 and 413 passing above the transistor 151 through the interconnects 221 and 222. This decreases the resistance value on the route from VSS to the transistor 151. Also, the drain of the transistor 151 is connected to the two external terminals 111 and 112 placed above the transistor near both ends thereof in the Y direction through the interconnects 211, 212, and 213. This decreases the resistance value on the route from VDDIO to the transistor 151.

Figure 6:
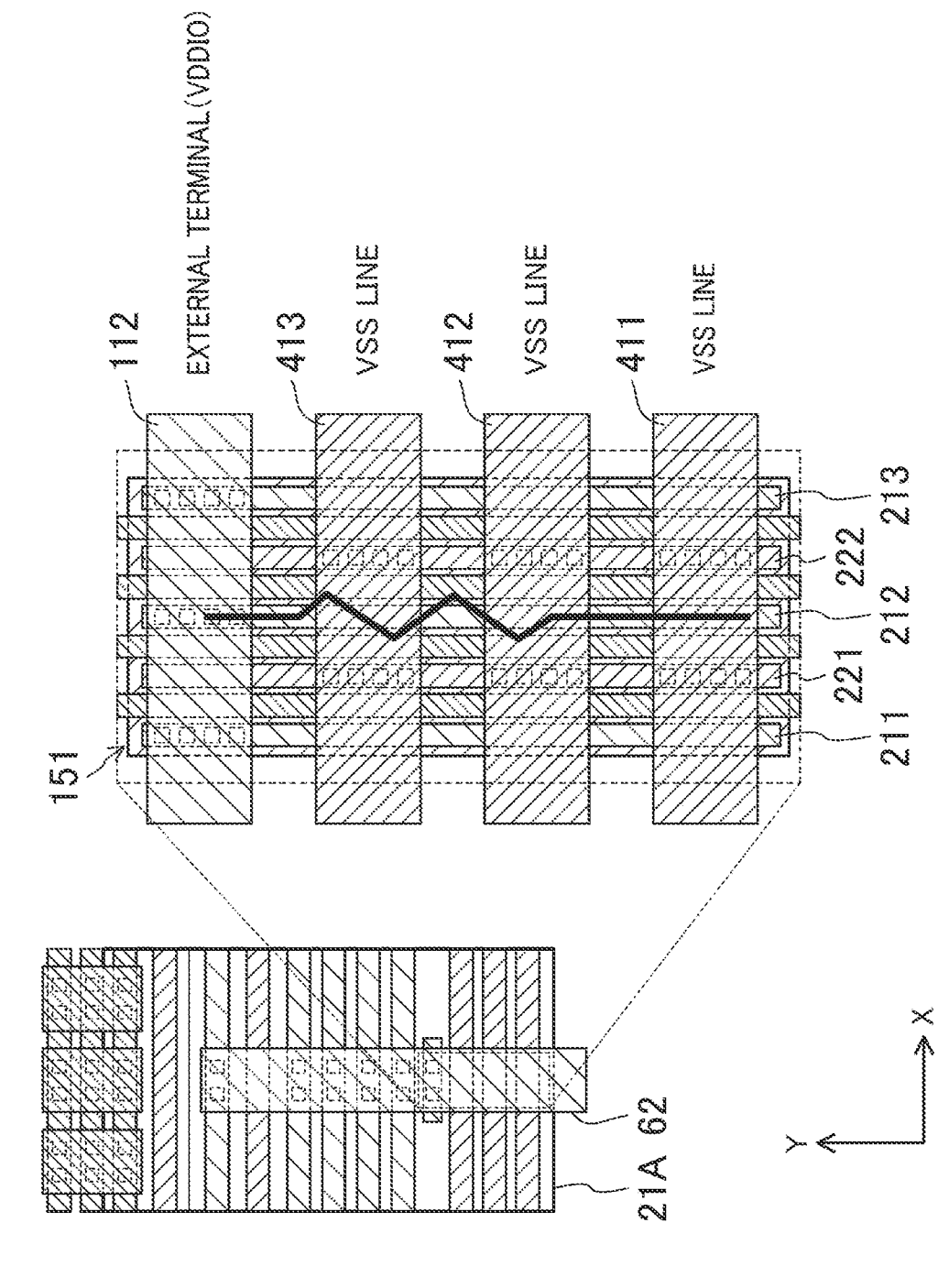
FIG. 6 shows a contrast example of the configuration of FIG. 5.

FIG. 6 is a plan view showing a contrast example. In the configuration of FIG. 6, the external terminal 111 is omitted, and instead the power supply line 411 supplying VSS passes in the IO power IO cell 21. In this configuration, since VDDIO is supplied to the drain of the transistor 151 from only one external terminal 112, the resistance value on the route from VDDIO will increase in a portion away from the external terminal 112.

Specifically, in this contrast example, assume that the resistance value on the route from the external terminal 112 to a portion of the transistor 151 farthest from the external terminal 112 (a lower end portion) is R. In the configuration of this embodiment shown in FIG. 5, the distance from the external terminals 111 and 112 to a portion of the transistor 151 farthest from the terminals 111 and 112 (a center portion) is ½ of that in the contrast example. Also, since VDDIO is supplied from the two external terminals 111 and 112, a configuration of two resistances being connected in parallel is produced. Therefore, in this embodiment, the resistance value on the route from the external terminals 111 and 112 to a portion of the transistor 151 farthest from the external terminals 111 and 112 is ¼ of that in the contrast example, i.e., R×(¼).

The external terminal 111 can be formed by removing part of the power supply line 411. This is therefore easy to design and causes no increase in area. Also, since only removal of part of the power supply line 411 is involved, increase in resistance value at the supply of VSS is prevented.

Figure 7:
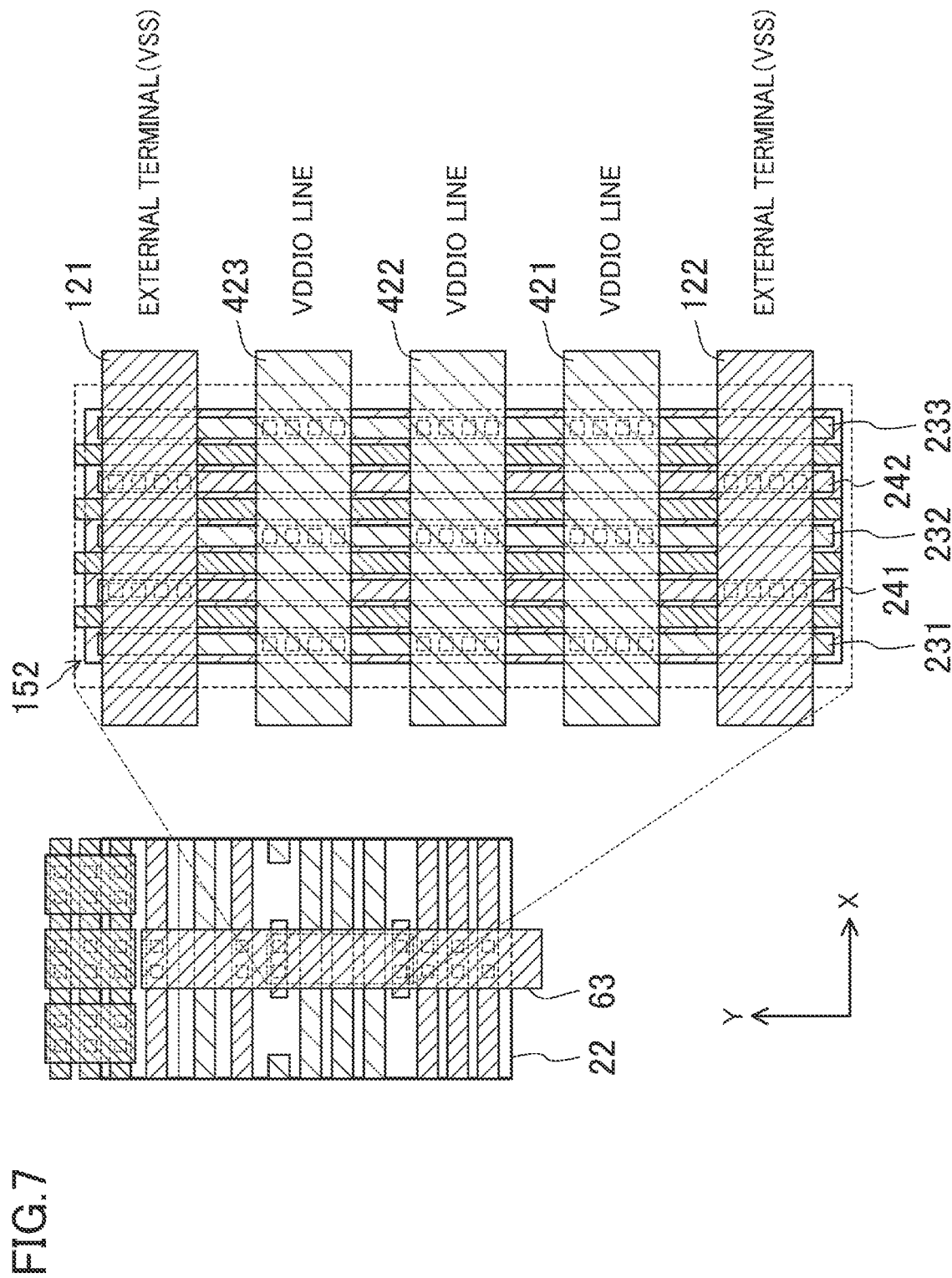
FIG. 7 is a plan view showing a configuration of a neighborhood of an ESD protection device in a VSS IO cell.

FIG. 7 is a plan view showing a configuration of a neighborhood of the ESD protection device in the VSS IO cell 22. In FIG. 7, interconnects 231, 232, and 233 and interconnects 241 and 242 extending in the Y direction are formed in an interconnect layer below the interconnect layer in which the external terminals 121 and 122 and the power supply lines 421, 422, and 423 are formed. A transistor 152 as the ESD protection device is formed under the interconnects 231, 232, and 233 and the interconnects 241 and 242. The interconnects 231, 232, and 233 are connected to a diffusion layer of the transistor 152 and also connected to the power supply lines 421, 422, and 423 through contacts. The interconnects 241 and 242 are connected to a diffusion layer of the transistor 152 and also connected to the external terminals 121 and 122 through contacts. Thus, the drain and source of the transistor 152 are connected to VDDIO and VSS, respectively.

The drain of the transistor 152 is connected to the power supply lines 421, 422, and 423 passing above the transistor 152 through the interconnects 231, 232, and 233. This decreases the resistance value on the route from VDDIO to the transistor 152. Also, the source of the transistor 152 is connected to the two external terminals 121 and 122 placed above the transistor 152 near both ends thereof in the Y direction through the interconnects 241 and 242. This decreases the resistance value on the route from VSS to the transistor 152.

The external terminal 121 can be formed by removing part of the power supply line 424. This is therefore easy to design and causes no increase in area. Also, since only removal of part of the power supply line 424 is involved, increase in resistance value at the supply of VDDIO is prevented.

Figure 8:
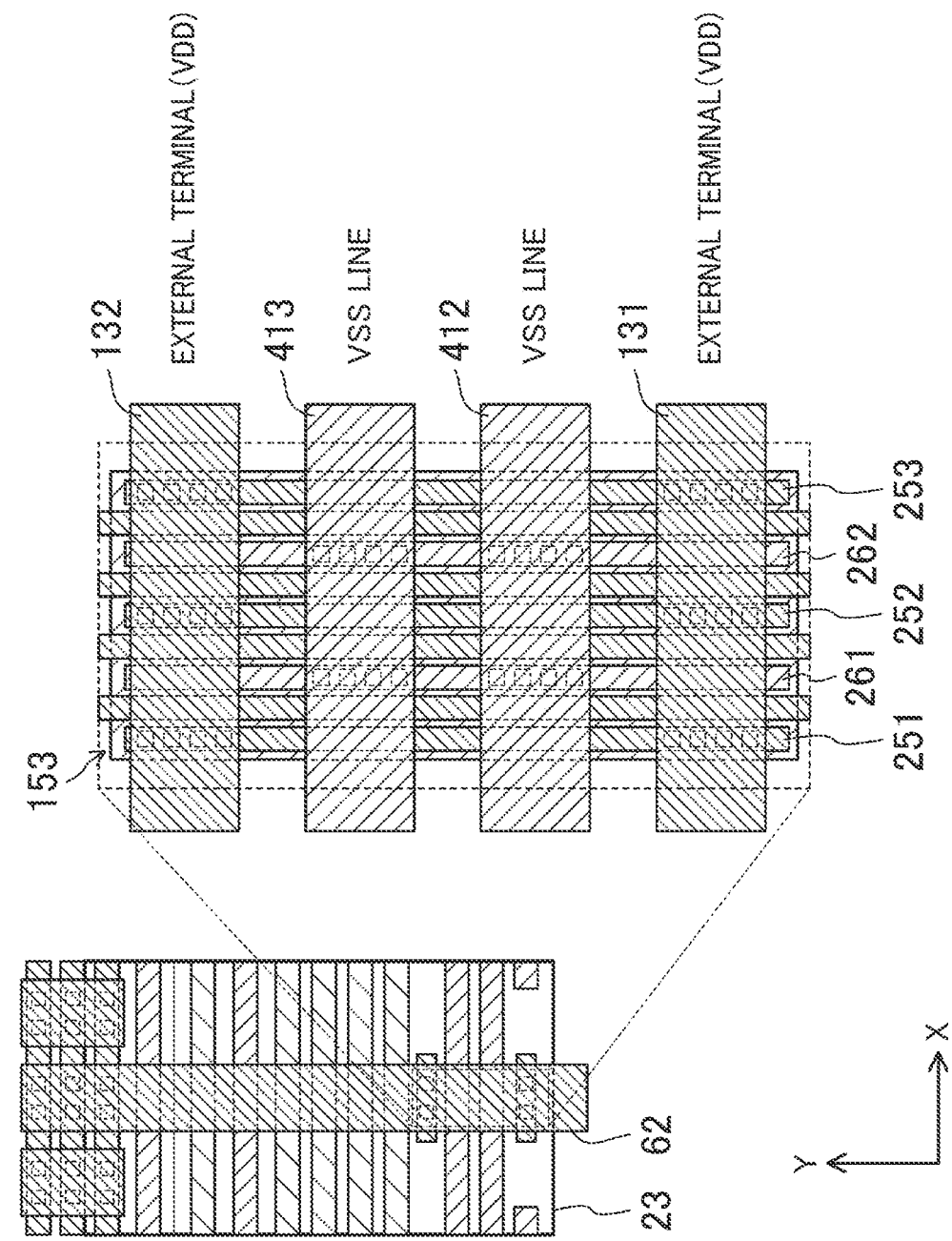
FIG. 8 is a plan view showing a configuration of a neighborhood of an ESD protection device in a core power IO cell.

FIG. 8 is a plan view showing a configuration of a neighborhood of the ESD protection device in the core power IO cell 23. In FIG. 8, interconnects 251, 252, and 253 and interconnects 261 and 262 extending in the Y direction are formed in an interconnect layer below the interconnect layer in which the external terminals 131 and 132 and the power supply lines 412 and 413 are formed. A transistor 153 as the ESD protection device is formed under the interconnects 251, 252, and 253 and the interconnects 261 and 262. The interconnects 251, 252, and 253 are connected to a diffusion layer of the transistor 153 and also connected to the external terminals 131 and 132 through contacts. The interconnects 261 and 262 are connected to a diffusion layer of the transistor 153 and also connected to the power supply lines 412 and 413 through contacts. Thus, the drain and source of the transistor 153 are connected to VDD and VSS, respectively.

The source of the transistor 153 is connected to the power supply lines 412 and 413 passing above the transistor 153 through the interconnects 261 and 262. This decreases the resistance value on the route from VSS to the transistor 153. Also, the drain of the transistor 153 is connected to the two external terminals 131 and 132 placed above the transistor near both ends thereof in the Y direction through the interconnects 251, 252, and 253. This decreases the resistance value on the route from VDD to the transistor 153.

The external terminal 131 can be formed by removing part of the power supply line 411. This is therefore easy to design and causes no increase in area. Also, since only removal of part of the power supply line 411 is involved, increase in resistance value at the supply of VSS is prevented.

As described above, according to this embodiment, the IO power IO cell 21 supplying VDDIO includes the external terminals 111 and 112 connected to the external connection pad 52 for VDDIO and the ESD protection device 151 provided between VDDIO and VSS. The ESD protection device 151, formed at least in a region between the external terminal 111 and the external terminal 112, is connected to the external terminals 111 and 112. That is, since the ESD protection device 151 is electrically connected to at least two external terminals 111 and 112, the resistance value on the route from VDDIO to the ESD protection device 151 is low. Also, the external terminal 111 is placed at roughly the same position in the Y direction as the power supply line 411 for VSS extending in the X direction placed in the signal IO cell 11. It is therefore possible to place the external terminal 111 without causing increase in the area of the semiconductor integrated circuit device 100.

Also, the VSS IO cell 22 supplying VSS includes the external terminals 121 and 122 connected to the external connection pad 53 for VSS and the ESD protection device 152 provided between VDDIO and VSS. The ESD protection device 152, formed at least in a region between the external terminal 121 and the external terminal 122, is connected to the external terminals 121 and 122. That is, since the ESD protection device 152 is electrically connected to at least two external terminals 121 and 122, the resistance value on the route from VSS to the ESD protection device 152 is low. Also, the external terminal 121 is placed at roughly the same position in the Y direction as the power supply line 424 for VDDIO extending in the X direction placed in the signal IO cell 11. It is therefore possible to place the external terminal 121 without causing increase in the area of the semiconductor integrated circuit device 100.

Also, the core power IO cell 23 supplying VDD includes the external terminals 131 and 132 connected to the external connection pad 54 for VDD and the ESD protection device 153 provided between VDD and VSS. The ESD protection device 153, formed at least in a region between the external terminal 131 and the external terminal 132, is connected to the external terminals 131 and 132. That is, since the ESD protection device 153 is electrically connected to at least two external terminals 131 and 132, the resistance value on the route from VDD to the ESD protection device 153 is low. Also, the external terminal 131 is placed at roughly the same position in the Y direction as the power supply line 411 for VSS extending in the X direction placed in the signal IO cell 11. It is therefore possible to place the external terminal 131 without causing increase in the area of the semiconductor integrated circuit device 100.

Thus, in the semiconductor integrated circuit device 100 where IO cells 10 are placed, it is possible to improve ESD tolerance while preventing increase in area.

While the external terminals 111 and 131 and the power supply line 411 are placed at roughly the same position in the Y direction in the above embodiment, it is only required for the external terminals 111 and 131 and the power supply line 411 to be placed at positions having an overlap in the Y direction. Similarly, while the external terminal 121 and the power supply line 424 are placed at roughly the same position in the Y direction, it is only required for the external terminal 121 and the power supply line 424 to be placed at positions having an overlap in the Y direction.

While two external terminals are provided for the ESD protection device in each power IO cell in the above embodiment, three or more external terminals may be provided.

Figure 9:
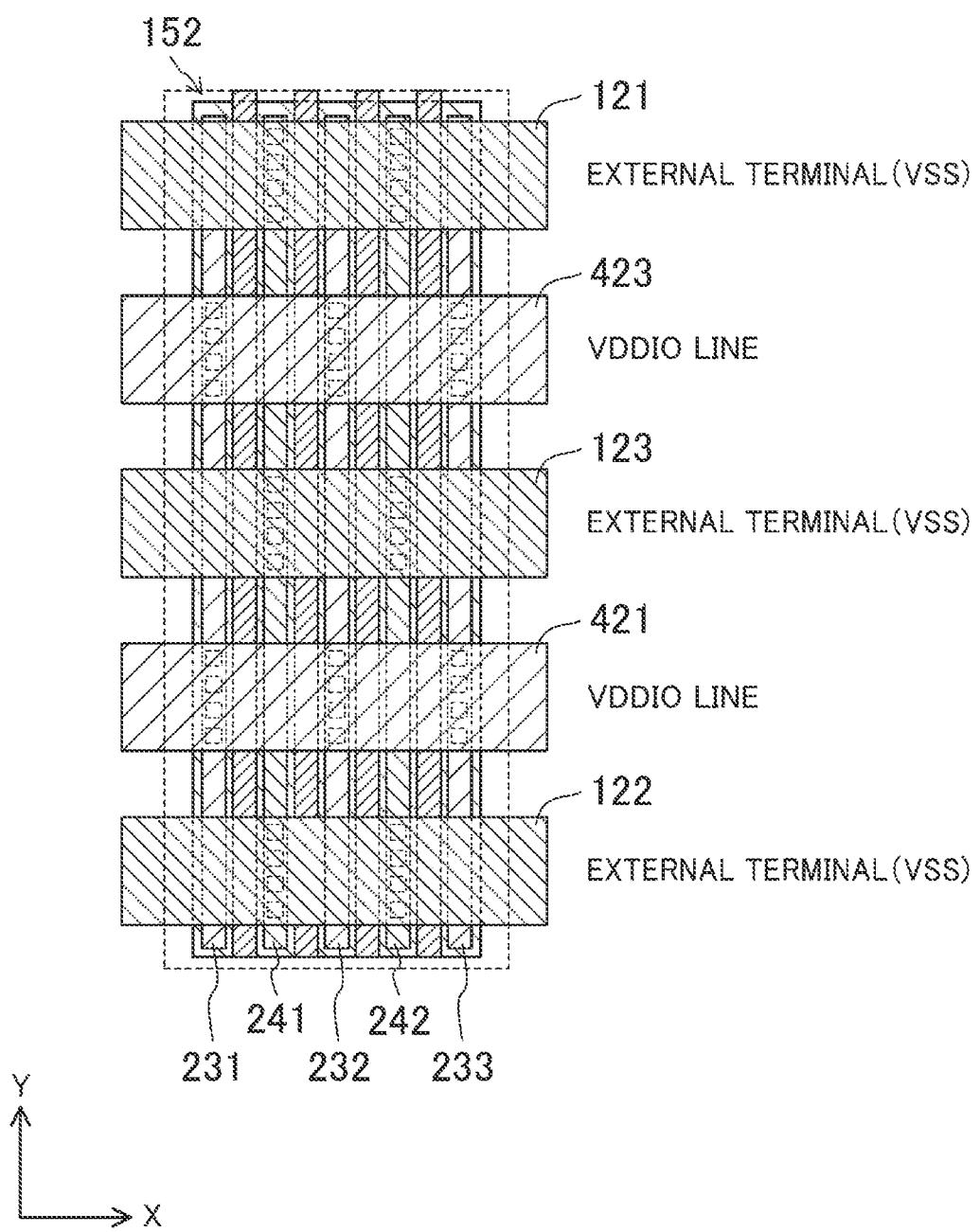
FIG. 9 shows an alteration of the configuration of FIG. 7.

FIG. 9 is an alteration of the configuration of FIG. 7. In the configuration of FIG. 9, in the VSS IO cell 22, an external terminal 123 supplying VSS is provided in place of the power supply line 422. The external terminal 123 is placed at a position having an overlap in the Y direction with the power supply line 422. The external terminal 123 is connected to the external connection pad 53 and also connected to the transistor 152 through the interconnects 241 and 242. This can further decrease the resistance value on the route from VSS to the transistor 152 compared to the above embodiment.

The positions of the ESD protection devices in the power IO cells are not limited to the illustrated ones. For example, in the IO power IO cell 21, the ESD protection device may be placed in a region other than the region between the external terminals 111 and 112.

While the group of VDD power supply lines, the group of VSS power supply lines, and the group of VDDIO power supply lines extending in the X direction are provided in the same interconnect layer in the above embodiment, they may be provided in different interconnect layers. Also, the power supply lines of each group may be formed in a single interconnect layer or in a plurality of interconnect layers. The numbers of lines constituting the group of VDD power supply lines, the group of VSS power supply lines, and the group of VDDIO power supply lines are not limited to those described in the above embodiment. For example, each group may be constituted by one line or a given number of lines.

The interconnect extending in the Y direction and the external terminals provided for each ESD protection device may be formed in a single interconnect layer or in a plurality of interconnect layers.

While the reinforcing interconnects extending in the Y direction are provided in the same interconnect layer in the above embodiment, they may be provided in different interconnect layers. Also, the reinforcing interconnects of each group may be formed in a single interconnect layer or in a plurality of interconnect layers. Note however that any interconnect in the lowermost layer of the reinforcing interconnects should be above any line in the uppermost layer of the power supply lines extending in the X direction. The number of reinforcing interconnects is not limited to that in the above embodiment. For example, while two reinforcing interconnects are provided in the signal IO cell 11, one reinforcing interconnect or three or more reinforcing interconnects may be provided.

While two kinds of power supply voltages, VDDIO and VDD, are supplied in the above embodiment, a power supply voltage other than these may be supplied. In this case, also, VSS power supply lines can be strengthened by providing a reinforcing interconnect that mutually connects a VSS power supply line in the low power supply voltage region and a VSS power supply line in the high power supply voltage region.

While the IO cell row 5 covers the entire peripheral portion of the semiconductor integrated circuit device 100 in the above embodiment, the configuration is not limited to this. For example, the IO cell row 5 may be provided in part of the peripheral portion of the semiconductor integrated circuit device 100. Also, the configuration of this embodiment does not need to be applied to the entire of the IO cell row 5, but may only need to be applied to part thereof.

According to the present disclosure, in a semiconductor integrated circuit device where IO cells are placed, it is possible to improve ESD tolerance while preventing increase in area. The present disclosure is therefore useful for improvement in the performance of LSIs, for example.

What is claimed is:

1. A semiconductor integrated circuit device, comprising:
a chip;
a core region provided on the chip;
an IO region provided on the chip; and
an IO cell row placed in the IO region, including a plurality of IO cells arranged in a first direction that is a direction along an outer edge of the chip,
wherein
the plurality of IO cells include
a signal IO cell performing input, output, or input/output of a signal, and
a power IO cell supplying a first power supply to at least either the core region or the IO region,
the power IO cell includes
an external connection pad for the first power supply,
first and second external terminals arranged along a second direction perpendicular to the first direction and connected to the external connection pad, and
an electrostatic discharge (ESD) protection device electrically connected between the first power supply and a second power supply, formed at least in a region between the first external terminal and the second external terminal along the second direction, and connected to the first and second external terminals,
each of the first and second external terminals connects the first power supply and the ESD protection device,
in the signal IO cell, a plurality of power supply lines for the second power supply extending in the first direction are placed, and
the second external terminal is placed at a position having an overlap in the second direction, with one of the plurality of power supply lines.

2. The semiconductor integrated circuit device of claim 1, wherein
the power IO cell includes
a third external terminal connected to the external connection pad for the first power supply and also connected to the ESD protection device, and
the third external terminal is placed at a position having an overlap in the second direction with one of the plurality of power supply lines.

3. The semiconductor integrated circuit device of claim 1, wherein
at least one of the plurality of power supply lines passes through the power IO cell.

4. The semiconductor integrated circuit device of claim 1, wherein
in the power IO cell, a power supply line for the first power supply extending in the first direction is placed between the first external terminal and the second external terminal.

5. The semiconductor integrated circuit device of claim 1, wherein
the ESD protection device is disposed closer to the core region than the external connection pad.

6. The semiconductor integrated circuit device of claim 2, wherein:
the ESD protection device includes a transistor having a source, a gate and a drain, and
the first external terminal and the second external terminals are connected one of the source or the drain, and the third external terminal is connected to another of the source or the drain.

* * * * *